(12) United States Patent
Thoma et al.

(10) Patent No.: US 12,433,000 B1
(45) Date of Patent: Sep. 30, 2025

(54) FIELD PLATE STRUCTURE TO REDUCE SELF-HEATING IN TRANSISTOR AND RELATED METHOD

(71) Applicant: GlobalFoundries U.S. Inc., Malta, NY (US)

(72) Inventors: Rainer Thoma, Jeffersonville, VT (US); Oscar D. Restrepo, Clifton Park, NY (US); Zhong-Xiang He, Essex, VT (US); Ajay Raman, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/946,251

(22) Filed: Nov. 13, 2024

(51) Int. Cl.
*H10D 64/00* (2025.01)
*H10D 30/47* (2025.01)

(52) U.S. Cl.
CPC ......... *H10D 64/111* (2025.01); *H10D 30/475* (2025.01)

(58) Field of Classification Search
CPC .................................................. H10D 64/111
See application file for complete search history.

(56) References Cited

U.S. PATENT DOCUMENTS

| | | | |
|---|---|---|---|
| 9,299,641 B2 | 3/2016 | Sekar et al. | |
| 9,496,197 B1 | 11/2016 | Micovic et al. | |
| 9,590,053 B2 | 3/2017 | Chou et al. | |
| 9,960,154 B2 | 5/2018 | Kinzer | |
| 10,446,542 B1 | 10/2019 | Kinzer | |
| 10,622,467 B2 | 4/2020 | Boles et al. | |
| 11,164,970 B2 | 11/2021 | Ho et al. | |
| 11,411,086 B2 | 8/2022 | Chen et al. | |
| 2012/0012858 A1* | 1/2012 | Inoue | H10D 64/251 257/E27.06 |
| 2016/0149007 A1* | 5/2016 | Chou | H10D 64/111 257/339 |
| 2023/0335630 A1* | 10/2023 | Lin | H10D 64/112 |
| 2024/0429295 A1* | 12/2024 | Chen | H10D 64/518 |

FOREIGN PATENT DOCUMENTS

EP 4195287 A1 6/2023

OTHER PUBLICATIONS

U.S. Appl. No. 18/617,971, filed Mar. 27, 2024, entitled "Heat Sink for Face Bonded Semiconductor Device," 45 pages.
(Continued)

*Primary Examiner* — Christopher A Johnson
(74) *Attorney, Agent, or Firm* — Francois Pagette; Hoffman Warnick LLC (57) ABSTRACT

A structure includes a transistor, e.g., HEMT, with a field plate positioned laterally to a side of an active gate and including a first portion extending over the active gate. A dielectric layer isolates a lower surface of the first portion from an upper surface of the active gate. A field plate contact includes interconnect layers located directly over the active gate and electrically coupled to the first portion directly over the active gate. The field plate contact allows electrical operation of the field plate, but also acts as a thermally conductive path from the active gate through the interconnect layers to cool likely hot spots within the transistor.

20 Claims, 5 Drawing Sheets

(56) References Cited

OTHER PUBLICATIONS

U.S. Appl. No. 18/664,185, filed May 14, 2024, entitled "MOS Gate Structure with Dummy Thermal Via," 48 pages.
Cosnier et al., "200 V GaN-on-SOI Smart Power Platform for Monolithic GaN Power ICs," 2021 IEEE International Electron Devices Meeting (IEDM), 2021 IEEE, 4 pages.
Sodan et al., "Influence of Field-Plate Configuration on Power Dissipation and Temperature Profiles in AlGaN/GaN on Silicon HEMTs, " IEEE Transactions on Electron Devices, 62:2416-2422, Aug. 2015, 7 pages.

\* cited by examiner

FIELD PLATE STRUCTURE TO REDUCE SELF-HEATING IN TRANSISTOR AND RELATED METHOD

STATEMENT REGARDING GOVERNMENT FUNDING

This application was made with government support under contract number HQ0727790700 awarded by the Defense Microelectronics Activity (DMEA). The U.S. government has certain rights in the invention.

BACKGROUND

The present disclosure relates to transistors, such as III-V high electron mobility transistors (HEMTs), III-V metal-insulator-semiconductor HEMTs (MISHEMTs) or other types of transistors. More particularly, the present disclosure relates to embodiments of a structure including a field plate contact to reduce self-heating in a transistor and a related method of forming a transistor.

III-V semiconductor devices, such as high electron mobility transistors (HEMTs) and metal-insulator-semiconductor HEMTs (MISHEMTs), have emerged as a leading technology for radio frequency (RF) and millimeter wave (mm-Wave) (e.g., 3-300 GHz) wireless applications. However, as device sizes continue to be reduced to enable better performance, HEMTs and MISHEMTs as well as other types of transistors can suffer from overheating when packaged in chip packages made of less thermally transmissive materials, such as plastics.

SUMMARY

All aspects, examples and features mentioned below can be combined in any technically possible way.

An aspect of the disclosure relates to a structure comprising: an active gate on a substrate; a field plate positioned laterally to a side of the active gate and including a first portion extending over the active gate; a first dielectric layer isolating a lower surface of the first portion of the field plate from an upper surface of the active gate by a distance D; and a field plate contact including a plurality of interconnect layers located directly over the active gate and electrically coupled to the first portion of the field plate directly over the active gate.

Another aspect of the disclosure includes a high electron mobility transistor (HEMT) comprising: an active gate on a substrate, the substrate including a stack of layers including a channel layer and a barrier layer on the channel layer; a first dielectric layer over the barrier layer, the active gate extending through the first dielectric layer to the barrier layer; a source region laterally to a first side of the active gate; a drain region laterally to a second, opposing side of the active gate; a field plate positioned laterally to a side of the active gate and including a first portion extending over the active gate; a second dielectric layer isolating a lower surface of the first portion of the field plate from an upper surface of the active gate by a distance D; and a field plate contact including a plurality of interconnect layers located directly over the active gate and electrically coupled to the first portion of the field plate over the active gate.

Another aspect of the disclosure includes a method comprising: forming a substrate including: a channel layer; a barrier layer on the channel layer; and a first dielectric layer on the barrier layer; and forming a high electron mobility transistor (HEMT) in the substrate such that the HEMT includes: an active gate on the substrate; a source region laterally to a first side of the active gate; a drain region laterally to a second, opposing side of the active gate; a field plate positioned laterally to a side of the active gate and including a first portion extending over the active gate; a second dielectric layer isolating a lower surface of the first portion of the field plate from an upper surface of the active gate by a distance D; and a field plate contact including a plurality of interconnect layers located directly over the active gate and electrically coupled to the first portion of the field plate over the active gate.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which are shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

As mentioned above, III-V semiconductor devices, such as high electron mobility transistors (HEMTs) and metal-insulator-semiconductor HEMTs (MISHEMTs), have emerged as a leading technology for radio frequency (RF) and millimeter wave (mmWave) (e.g., 3-300 GHz) wireless applications. However, as device sizes continue to be reduced to enable better performance, HEMTs and MISHEMTs as well as other types of transistors experience higher temperatures and can suffer from overheating. In HEMTs, edges of active gates, especially on drain side of the transistor, are locations that experience higher self-heating. The overheating issue can be increased where transistors are packaged with materials that are less expensive but also less thermally conductive, like certain plastics and/or ceramics. More particularly, the packaging materials do not always provide sufficient thermal dispersion to prevent unacceptable overheating in the transistors.

In view of the foregoing, disclosed herein are embodiments of a structure that includes a transistor (e.g., a high electron mobility transistor (HEMT), a metal-insulator-semiconductor HEMT (MISHEMT), etc.) or other transistor type with a field plate positioned laterally to a side of an active gate of the transistor and including a first portion extending over the active gate. The structure also includes a dielectric layer isolating a lower surface of the first portion of the field plate from an upper surface of the active gate by a distance D, and a field plate contact including a plurality of interconnect layers located directly over the active gate and electrically coupled to the first portion of the field plate directly over the active gate. The field plate contact allows electrical operation of the field plate, but also acts as a thermally conductive path from the active gate through the interconnect layers for likely hot spots within the transistor, e.g., edges of the active gate. The structure allows transistors that operate at high-power levels with high temperatures, like HEMTs, to run at a lower temperature through increased cooling (e.g., 10-15% increase) provided by the field plate contact. As a result, the transistors exhibit higher electron mobility, lower internal resistance, better efficiency and radio frequency (RF) performance, and improved longevity. The geometry and/or routing of the vertical field plate contact also provides additional capacitance coupling to the contacts for a source region, an active gate and/or a drain region with competitive RF performance in terms of maximum frequency, transition frequency, transduction, etc.

Figure 1:
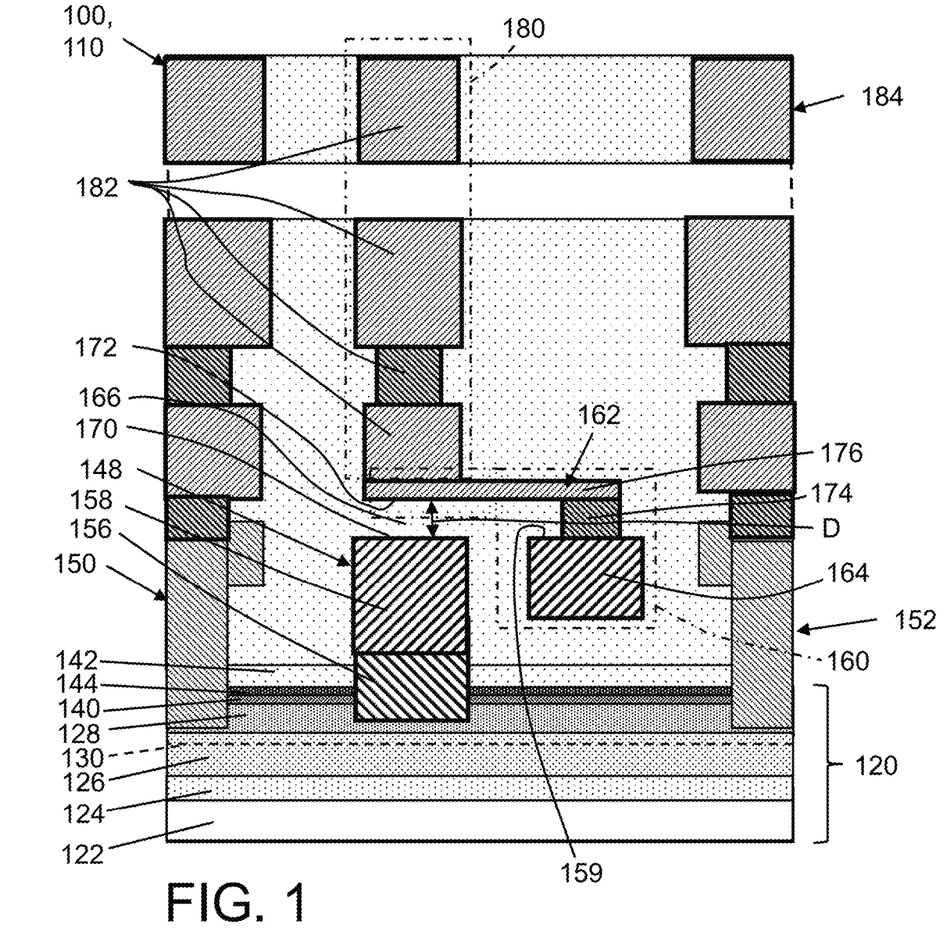
FIG. 1 shows a cross-sectional view of a structure, including a transistor, according to embodiments of the disclosure.
Figure 2:
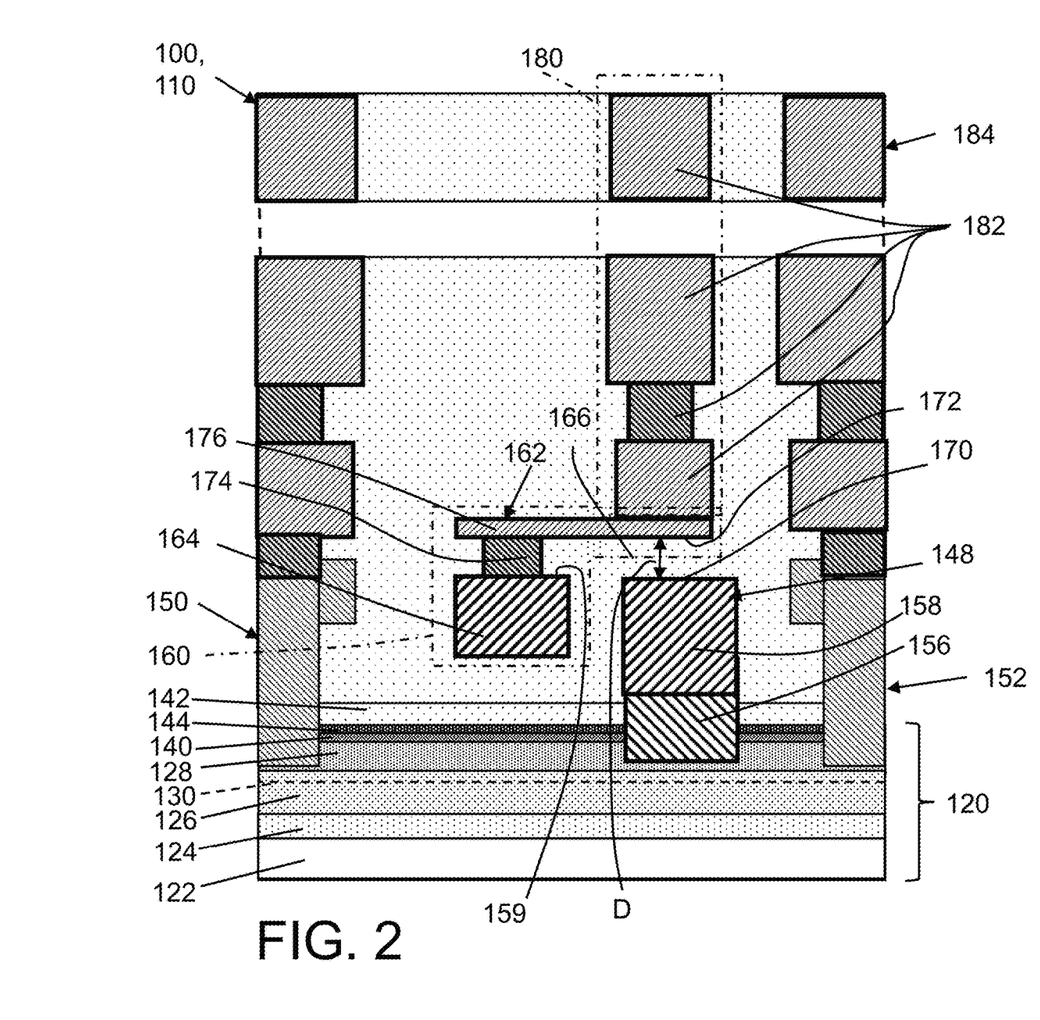
FIG. 2 shows a cross-sectional view of a structure, including a transistor, according to other embodiments of the disclosure.

FIGS. 1 and 2 show cross-sectional views of a structure 100 according to various embodiments of the disclosure. Structure 100 may include, among other structures, a transistor 110. Transistor 110 may take the form of, for example, a high electron mobility transistor (HEMT), a metal-insulator-semiconductor HEMT (MISHEMT), or other transistor type. For purposes of description, structure 100 will be described mainly as a HEMT.

Structure 100 and transistor 110 can include multiple epitaxially grown semiconductor layers of a substrate 120. More particularly, substrate 120 includes a semiconductor base 122 that can be, for example, a silicon or silicon-based substrate (e.g., a silicon carbide (SIC) substrate), a sapphire substrate, a III-V semiconductor substrate (e.g., a gallium nitride (GaN) substrate or some other suitable III-V semiconductor substrate), a silicon substrate (perhaps doped p-type), or any other suitable substrate for a III-V semiconductor device. Epitaxially grown semiconductor layers of substrate 120 can include, for example: an optional buffer layer 124 on the top surface of semiconductor base 122; a channel layer 126 on buffer layer 124; and a barrier layer 128 on channel layer 126. These epitaxial grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP).

Optional buffer layer 124 can be employed to facilitate growth of channel layer 126 and to provide for lattice constants of substrate 120 below and channel layer 126 above. Buffer layer 124 can be doped or undoped. Optionally, buffer layer 124 can be carbon-doped. Barrier layer 128 can have a band gap that is wider than the bandgap of channel layer 126 for the device channel. Those skilled in the art will recognize that the barrier and channel materials can be selected so that a heterojunction is formed at the interface between the two layers, thereby resulting in the formation of a two-dimensional electron gas (2DEG) region 130 in channel layer 126 (see dashed box). This 2DEG region 130 in channel layer 126 can provide the conductive pathway for the drifting of charges between a source region 150 and a drain region 152. Transistor 110 may be a depletion mode HEMT or an enhancement mode HEMT.

In some embodiments, buffer layer 124 could be a carbon-doped gallium nitride (C—GaN) buffer layer or a buffer layer of any other material suitable for use as a buffer layer of a HEMT or MISHEMT. Channel layer 126 could be a gallium nitride (GaN) layer or a III-V semiconductor channel layer made of any other III-V semiconductor compound suitable for use as a channel layer in a HEMT or MISHEMT. Hence, channel layer 126 may also be referenced as a "GaN channel layer" herein. Barrier layer 128 could be an aluminum gallium nitride (AlGaN) barrier layer or a barrier layer of any other material suitable for use as a barrier layer in a HEMT or MISHEMT. Hence, barrier layer 128 may also be referenced as an "AlGaN barrier layer" herein. For purposes of illustration, the figures and the description depict the epitaxially grown layers (e.g., buffer layer 124; channel layer 126; and barrier layer 128) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

One or more passivation layers may be over barrier layer 128. In the example shown, two passivation layers 140, 142 are shown with an etch stop layer 144 therebetween. Passivation layers 140, 142 may include one or more layers of any appropriate passivation material such as but not limited to aluminum oxide, silicon nitride and/or silicon oxide. For purposes of illustration, the figures and the description depict passivation layers 140, 142 as being single layered structures. However, it should be understood that, alternatively, one or both passivation layers 140, 142 could be multi-layered structures, e.g., comprising multiple sub-layers of different passivation materials. In certain embodiments, passivation layer 142 may include any interlevel or intralevel dielectric material including inorganic dielectric materials, organic dielectric materials, or combinations thereof. In this case, suitable passivation layer 142 (also referred to herein as "dielectric layer") materials may include but are not limited to: silicon oxide; silicon nitride; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric.

Etch stop layer 144 may be provided between passivation layers 140, 142 to protect the lower passivation layer 140 during etching processes. Etch stop layer 144 may include any now known or later developed etch stop material such as silicon nitride.

Structure 100 includes an active gate 148 over substrate 120. Active gate 148 extends through passivation (dielectric) layers 140, 142 and etch stop layer 144, to barrier layer 128. Structure 100 may also include a source region 150 laterally to a first side (left as shown in FIGS. 1-2) of active gate 148, and a drain region 152 laterally to a second, opposing side (right as shown in FIGS. 1-2) of active gate 148. As will be described in more detail herein, structure 100 also includes a field plate 160 positioned laterally to a side (right side in FIG. 1, left side in FIG. 2) of active gate 148. In FIG. 1, a portion of field plate 160 is between active gate 148 and drain region 152, and in FIG. 2, a portion of field plate 160 is between active region 148 and source region 150.

Active gate 148 may include a plurality of layers including, for example, a metallic layer 158 and an optional p-type GaN (pGaN) layer 156 (as illustrated) stacked vertically between barrier layer 128 and metallic layer 158. With the inclusion of optional pGaN layer 156, active gate 148 may also be referenced herein as a "pGaN gate." Those skilled in the art will recognize that with pGaN layer 156 in active gate 148, transistor 110 functions as an enhancement mode (e-mode) device. Without pGaN layer 156 in active gate 148, transistor 110 functions as a depletion mode (d-mode) device. In certain embodiments, pGaN layer 156 is in direct contact with metallic layer 158, i.e., there are no intervening layers. Metallic layer 158 may include, for example, a metal or metal alloy such as but not limited to titanium aluminum or titanium nitride, and an ohmic contact such as titanium nitride (TiN) or any other appropriate ohmic contact material. pGaN layer 156 may include, for example, p-type doped gallium nitride. The p-type dopant may include any appropriate p-type dopant for GaN such as but not limited to magnesium, zinc, cadmium and carbon. As noted, active gate 148 is in electric contact with barrier layer 128 so it can control functioning of 2DEG region 130. Source region 150 and drain region 152 may each include an ohmic metal or metal alloy such as but not limited to titanium aluminum or titanium nitride, to provide ohmic contacts to barrier layer 128.

As noted, field plate 160 is positioned laterally to a side of active gate 148. Field plate 160 may include a first portion 162 and a second portion 164. Field plates are oftentimes used within HEMTs to shape an electric field within the III-V semiconductor substrate 120, which may be irregularly shaped, e.g., with the peak electric field strength in close proximity to sensitive components like active gate 148 of transistor 110. The strong electric fields may negatively affect the p-type gallium nitride (pGaN) material within active gate 148, for example, as is relevant to this disclosure, by overheating a region next to active gate 148. In certain embodiments, second portion 164 may be referred to as a "field plate gate" since it is formed with and similarly situated relative to active gate 148, e.g., an upper surface 159 of second portion 164 is coplanar with to an upper surface 170 of active gate 148. In FIG. 1, second portion 164 of field plate 160 is between active gate 148 and drain region 152, and in FIG. 2, second portion 164 of field plate 160 is between active region 148 and source region 150.

Figure 3:
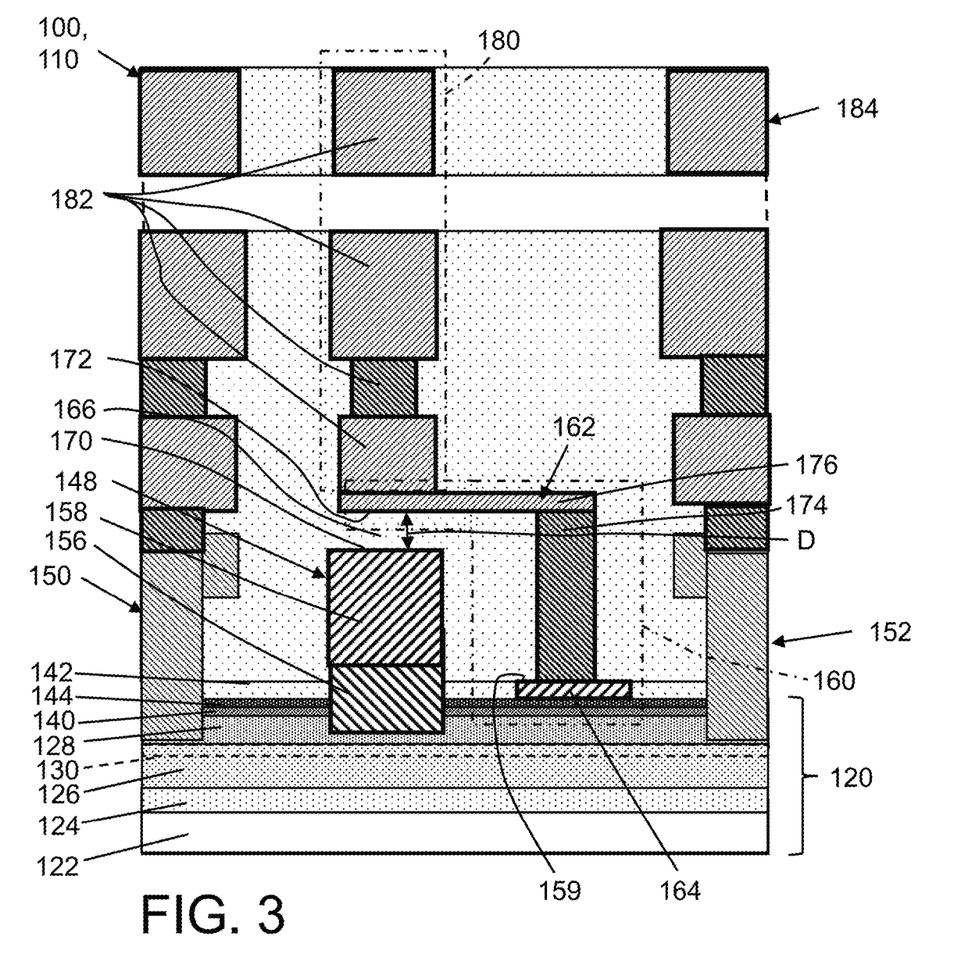
FIG. 3 shows a cross-sectional view of a structure, including a transistor, according to further embodiments.

In other embodiments described herein, second portion 164 may be located in layers lower than active gate 148, e.g., see FIG. 3. For example, second portion 164 may be located in passivation layer 140 or 142. Typically, the field plate is referenced as: FP0, FP1 or FP2, etc., depending on the metal layer in which it is located. As illustrated, field plate 160 would be both FP1 (second portion 164) and FP2 (first portion 162). Although not shown, second portion 164 (field plate gate) may include a step therein to provide field shaping to reduce the impact of sharp corners/edges that can result in a strong electric field that can change functions of the devices. Second portion 164 may include, for example, titanium nitride or titanium aluminum. First portion 162 may include any now known or later developed middle-of-line (MOL) or back-end-of-line (BEOL) interconnect conductive materials such as but not limited to copper or aluminum within a refractory metal liner (not shown for clarity).

In contrast to conventional field plates, first portion 162 of field plate 160 extends over active gate 148, i.e., in a dielectric layer of an interconnect layer. Structure 100 also includes a (first or second) dielectric layer 166 isolating a lower surface 172 of first portion 162 of field plate 160 from an upper surface 170 of active gate 148 by a distance D. Hence, first portion 162 of field plate 160 is electrically isolated from active gate 148 but, as will be described further, is thermally connected to active gate 148 by dielectric layer 166. Although other dimensions are possible depending on a size of structure 100, in certain embodiments, distance D may be at least 10 nanometers.

First portion 162 of field plate 160 may include a vertical riser portion 174, e.g., a vertical conductive via, to position a laterally extending portion 176, e.g., a laterally extending wire, thereof above upper surface 170 of active gate 148. First portion 162 extends at least partially through dielectric layer 166. Dielectric layer 166 may include any interlevel or intra-level dielectric material listed herein for passivation layer 142, e.g., silicon oxide. First portion 162 may include any now known or later developed interconnect layer conductive materials such as copper or aluminum in a refractory metal liner.

Structure 100 also includes a field plate contact 180 including a plurality of interconnect layers 182 located directly over active gate 148 and electrically coupled to first portion 162 of field plate 160 directly over active gate 148. Field plate contact 180 extends from first portion 162 of field plate 160 to a last (uppermost) metal layer 184 of interconnect layers 182. Field plate contact 180 may be used to control operation of field plate 160, i.e., by transmitting an electric signal therethrough to field plate 160. Interconnect layers 182 are devoid of electric contacts to field plate 160 other than field plate contact 180. Plurality of interconnect layers 182 (hereafter "interconnect layers 182") may include any now known or later developed MOL and/or BEOL interconnect layers depending on the location of first portion 162 of field plate 160. While four to five interconnect layers 182 are shown, it is recognized that more layers are possible (see vertical dashed lines below last metal layer 184 indicating interconnect layers 182 omitted for clarity). As understood in the field, interconnect layers 182 are formed by depositing an insulator layer, e.g., in interlevel dielectric listed herein for passivation layer 142. One or more of contacts or wires to underlying circuit elements may be formed within predetermined portions of an insulator layer by a controlled amount of vertical etching to form openings to one or more contact or wires sites, and then filling the openings with a refractory metal liner and then a conductor. Each contact or wire may include any currently known or later developed conductive material configured for use in an electrical contact or wire, e.g., tungsten, copper, aluminum. Contacts and wires may additionally include refractory metal liners (not shown) positioned alongside the respective insulator layer to prevent electromigration degradation, shorting to other components, etc. MOL refers to fabrication operations on structure 100 in the course of device manufacturing up to active gate 148, i.e., the layer in which active gate 148 and second portion 164 of field plate 160 are shown and after barrier layer 128 formation. BEOL refers to fabrication operations performed after a first metallization, i.e., the layer above active gate 148 and second portion 164 of field plate 160. Structure 100 also includes an active gate contact 168 (located into or out of page of FIGS. 1-2, example shown in schematic top-down view in FIG. 4) that electrically contacts active gate 148 and routes to last (uppermost) metal layer 184 of interconnect layers 182 for operation thereof.

FIG. 3 shows a cross-sectional view of structure 100, including transistor 110, according to other embodiments. In this version, second portion 164 of field plate 160 is at least partially positioned within a dielectric layer, i.e., passivation layer 142. Here, field plate 160 is closer to 2DEG region 130 for more control of the electric field, but also includes first portion 162 to provide improved thermal dissipation through interconnect layers 182. In this case, vertical riser portion 174 includes one or more contact(s) to electrically couple field plate contact 180 to second portion 164 of field plate 160. While the alternative positioning of second portion 164 of field plate 160 in FIG. 3 is shown with second portion 164 between active gate 148 and drain region 152, it will be recognized that the alternative positioning of second portion 164 may also be applied to the FIG. 2 embodiment in which second portion 164 is between active gate 148 and source region 150.

In FIGS. 1-3, field plate contact 180 is directly over active gate 148 and is shown as a mostly straight vertical structure to provide efficient thermal cooling of active gate 148. However, field plate contact 180 may have different geometry and/or routing than that shown, e.g., it can diverge from a strictly vertical field plate contact, to provide additional capacitance coupling to contacts for source region 150, active gate 148 and/or drain region 152.

Figure 4:
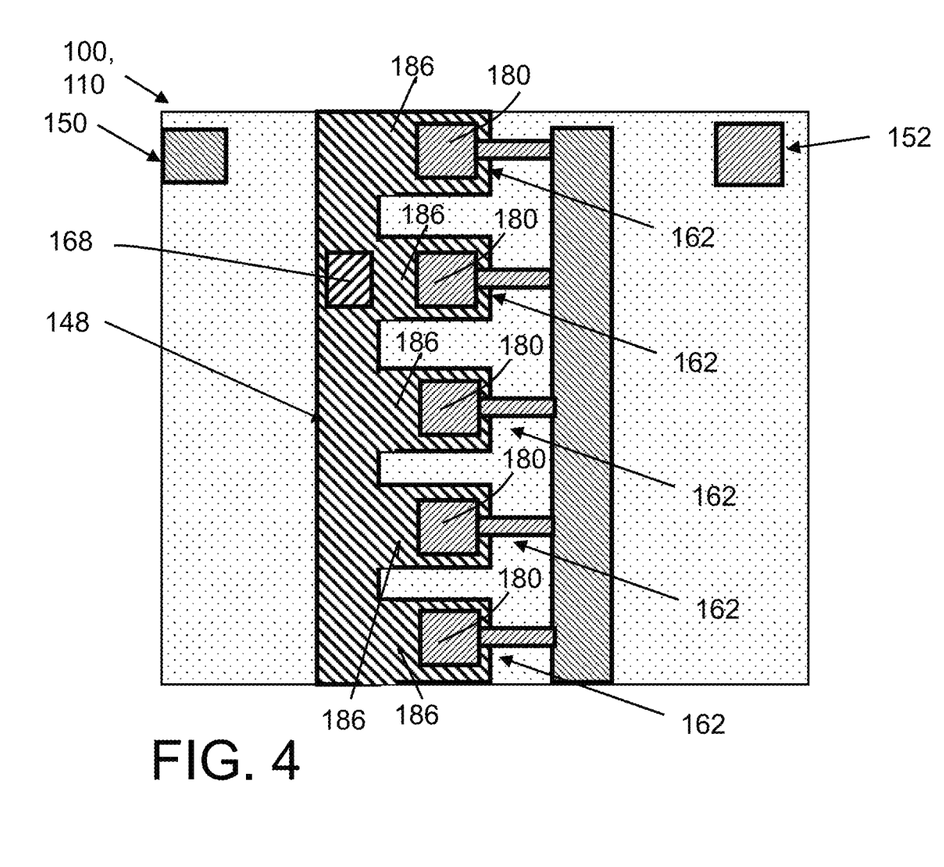
FIG. 4 shows a schematic top-down view of a structure, including a transistor, according to additional embodiments.

FIG. 4 shows a schematic top-down view of structure 100, including transistor 110, according to other embodiments. In certain embodiments, active gate 148 may include a plurality of fingers 186. While five fingers 186 are shown in FIG. 4, any number may be used. Where fingers 186 are used, field plate 160 includes a respective first portion 162 extending directly over two or more of fingers 186. Hence, field plate 160 also includes fingers formed from two or more first portions 162. While FIG. 4 shows a first portion 162 (field plate finger) over each finger 186 of active gate 148, this is not necessary in all cases. As also shown in FIG. 4, a field plate contact 180 may be provided over each first portion 162 provided to thermally cool each finger 186. FIG. 4 also shows an active gate contact 168 to active gate 148. Active gate contact 168 may be formed similarly to field plate contact 180.

Referring again to FIGS. 1-2, embodiments of the disclosure also include a HEMT, i.e., transistor 110, including active gate 148 on substrate 120. Substrate 120 may include a stack of layers including channel layer 126, barrier layer 128 on channel layer 126 and a dielectric layer, i.e., passivation layer(s) 140, 142, over barrier layer 128. Transistor 110 may also include source region 150 laterally to a first side (left as shown) of active gate 148, and drain region 152 laterally to second, opposing side (right side as shown) of active gate 148. Transistor 110 also includes field plate 160 positioned laterally to a side of active gate 148, e.g., to right side in FIG. 1 between active gate 148 and drain region 152 in FIG. 1, and to left side in FIG. 2 between active gate 148 and source region 150. Field plate 160 includes first portion 162 extending over active gate 148, and second portion 164. Transistor 110 also includes dielectric layer 166 isolating lower surface 172 of first portion 162 of field plate 160 from upper surface 170 of active gate 148 by distance D. In certain embodiments, shown in FIG. 3, second portion 164 of field plate 160 may be at least partially positioned within a dielectric layer shared by active gate 148, e.g., passivation layer(s) 140, 142. Field plate contact 180 includes interconnect layers 182 located directly over active gate 148 and electrically coupled to first portion 162 of field plate 160 over active gate 148. In FIG. 1 (and FIG. 4), second portion 164 of field plate 160 is between active gate 148 and drain region 152. Active gate 148, as shown in FIG. 4, may include fingers 186. If fingers 186 are used, field plate 160 may likewise include first portion 162 extending directly over two or more fingers 186 of active gate 148. As noted, a field plate contact 180 may be over each first portion 162 (finger) of field plate 160 directly over a respective finger 186 of active gate 148 to cool fingers 186 of active gate 148.

Figure 5:
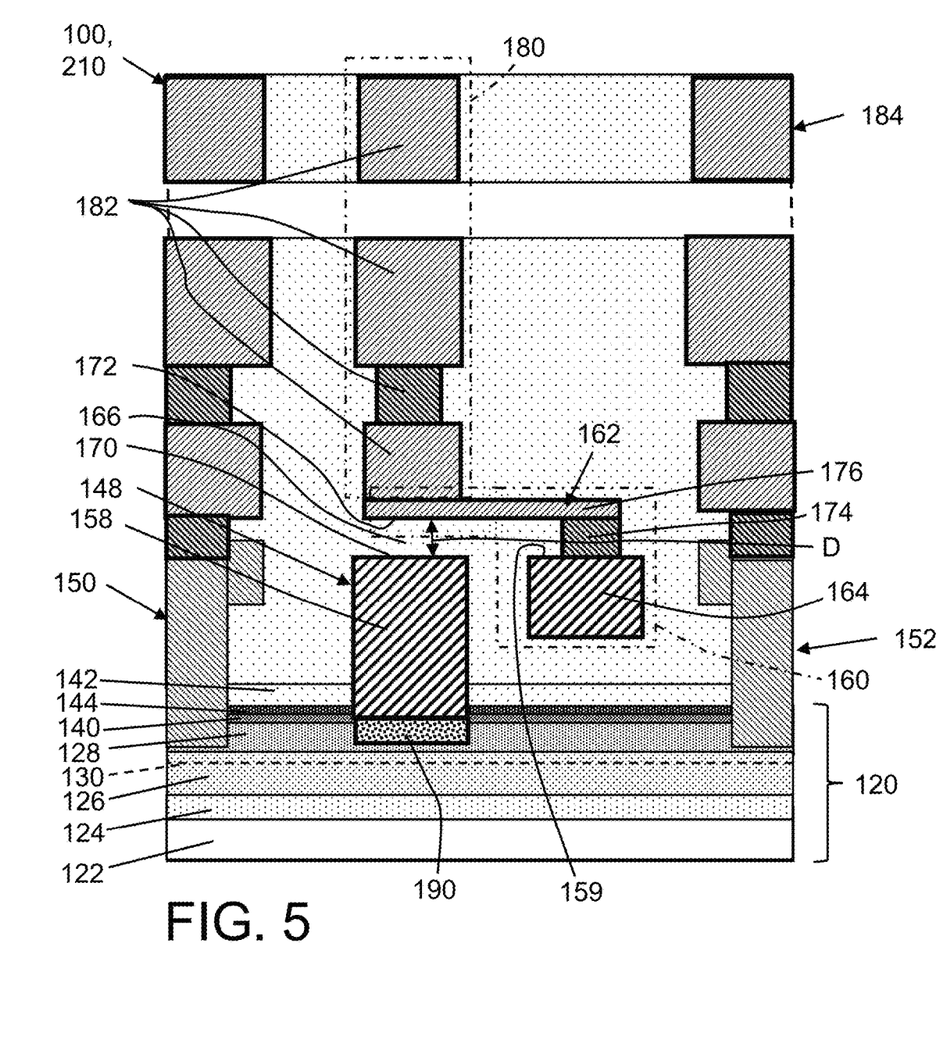
FIG. 5 shows a cross-sectional view of a structure, including a transistor, according to yet other embodiments of the disclosure.

FIG. 5 shows a cross-sectional view of structure 100 in the form of a MISHEMT 210, e.g., an enhancement mode MIHEMT. MISHEMT 210 is identical to the HEMT version (transistor 110) except active gate 148 includes an additional gate dielectric layer 190 between gate conductor 158 (e.g., metal or polysilicon) and 2DEG region 130, forming a metal-insulator-semiconductor (MIS) interface. Although not shown, gate dielectric layer 190 can also line the gate opening and, optionally, can extend laterally onto the dielectric surface at the top edge of the gate opening. Gate dielectric layer 190 can be a dielectric material with a relatively high dielectric constant (K) (e.g., K is greater than the 3.9 dielectric constant of silicon dioxide). This high-K dielectric material could be, for example, aluminum oxide, tantalum oxide, zirconium oxide, a hafnium (Hf)-based dielectric material (e.g., hafnium oxide, hafnium silicon oxide, hafnium silicon oxynitride, hafnium aluminum oxide, etc.) or some other suitable high-K dielectric material. Alternatively, gate dielectric layer 190 could be, for example, a silicon dioxide ($SiO_2$) layer or a layer of any other dielectric material suitable for use as a gate dielectric layer of a MISHEMT. Gate conductor 158 can fill the remaining space within the gate opening. While FIG. 5 shows MISHEMT 210 with second portion 164 of field plate 160 between active gate 148 and drain region 152, it will be recognized that the alternative positioning of second portion 164 may also be applied to the FIG. 5 embodiment in which second portion 164 is between active gate 148 and source region 150.

Structure 100 and transistor 110 may be formed using any now known or later developed semiconductor fabrication techniques. A method may include forming a stack of layers, i.e., substrate 120 as described herein, including semiconductor base layer 122, buffer layer 124, and notably, channel layer 126, barrier layer 128 on channel layer 126, and dielectric layer(s), e.g., passivation layer(s) 140, 142 on barrier layer 128. Channel layer 126 and barrier layer 128 may be formed by epitaxial growth. Dielectric layer(s) may be formed using any now known or later developed deposition technique appropriate for the layers to be formed, e.g., chemical vapor deposition for silicon oxide. The method may also include forming transistor 110, i.e., a HEMT or MISHEMT, in the stack such that transistor 110 includes the features described herein. More particularly, transistor 110 includes active gate 148 on substrate 120, source region 150 laterally to a first side (left as shown) of active gate 148, and drain region 152 laterally to second, opposing side (right side as shown) of active gate 148. Active gate 148, source region 150 and drain region 152 may be formed by material deposition, e.g., atomic layer deposition (ALD) and photolithographic patterning, of the relevant material layers as described herein.

The method may also form field plate 160 positioned laterally to a side of active gate 148, e.g., to right side in FIG. 1 between active gate 148 and drain region 152 in FIG. 1 and to left side in FIG. 2 between active gate 148 and source region 150. Field plate 160 includes first portion 162 extending over active gate 148, and second portion 164. Forming transistor 110 also includes forming dielectric layer 166 isolating lower surface 172 of first portion 162 of field plate 160 from upper surface 170 of active gate 148 by distance D. In certain embodiments, shown in FIG. 3, second portion 164 of field plate 160 may be at least partially positioned within a dielectric layer shared by active gate 148, e.g., passivation layer(s) 140, 142. The method may also include forming field plate contact 180 in plurality of interconnect layers 182 located directly over active gate 148 and electrically coupled to first portion 162 of field plate 160 over active gate 148. Field plate 160 and field plate contact 180 forming may include any now known or later developed interconnect formation, e.g., performing one or more dielectric layer depositions, pattern exposures, etching of openings in the dielectric layer(s), conductor/liner deposition and planarization.

Embodiments of the disclosure provide various technical and commercial advantages, examples of which are discussed herein. For example, the field plate contact allows electrical operation of the field plate, but also acts as a thermally conductive path from the active gate through the interconnect layers for likely hot spots within the transistor. The structure allows transistors that operate at high-power levels with high temperatures, like HEMTs, to run at a lower temperature through increased cooling (e.g., 10-15% increase) provided by the field plate contact. In another example, the transistors exhibit higher electron mobility, lower internal resistance, better efficiency and radio frequency (RF) performance, and improved longevity. The geometry and/or routing of vertical field plate contact may also provide additional capacitance coupling to the source, gate, and drain contacts with reasonable RF performance.

Additionally, it should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier or ceramic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
    an active gate on a substrate;
    a field plate positioned laterally to a side of the active gate and including a first portion extending over the active gate;
    a first dielectric layer isolating a lower surface of the first portion of the field plate from an upper surface of the active gate by a distance D; and
    a field plate contact including a plurality of interconnect layers located vertically over the active gate and electrically coupled to the first portion of the field plate vertically over the active gate and extending from the first portion of the field plate to a last metal layer.

2. The structure of claim 1, wherein the substrate includes a stack of layers including a channel layer, a barrier layer on the channel layer, and a second dielectric layer on the barrier layer.

3. The structure of claim 2, further comprising a source region laterally to a first side of the active gate, and a drain region laterally to a second, opposing side of the active gate.

4. The structure of claim 3, wherein a second portion of the field plate is between the active gate and the drain region.

5. The structure of claim 4, wherein the second portion of the field plate is at least partially positioned within the second dielectric layer.

6. The structure of claim 3, wherein a second portion of the field plate is between the active gate and the source region.

7. The structure of claim 1, wherein the active gate includes a p-type GaN (pGaN) layer underneath a metallic layer.

8. The structure of claim 1, wherein the active gate includes a plurality of fingers, the field plate includes a respective first portion extending vertically over two or more of the plurality of fingers, and the field plate contact includes a field plate contact over each first portion.

9. The structure of claim 1, wherein the distance D is at least 10 nanometers.

10. The structure of claim 1, wherein the plurality of interconnect layers are devoid of electric contacts to the field plate other than the field plate contact.

11. A high electron mobility transistor (HEMT) comprising:
    an active gate including a plurality of fingers, on a substrate, the substrate including a stack of layers including a channel layer and a barrier layer on the channel layer;
    a first dielectric layer over the barrier layer, the active gate extending through the first dielectric layer to the barrier layer;
    a source region laterally to a first side of the active gate;
    a drain region laterally to a second, opposing side of the active gate;
    a field plate positioned laterally to a side of the active gate and including a first portion extending over the active gate;
    a second dielectric layer isolating a lower surface of the first portion of the field plate from an upper surface of the active gate by a distance D; and
    a field plate contact including a plurality of interconnect layers located vertically over the active gate and electrically coupled to the first portion of the field plate over the active gate, wherein the field plate includes a respective first portion extending vertically over two or more of the plurality of fingers, and the field plate contact includes a field plate contact over each first portion.

12. The HEMT of claim 11, wherein a second portion of the field plate is between the active gate and the drain region.

13. The HEMT of claim 12, wherein the second portion of the field plate is at least partially positioned within the first dielectric layer.

14. The HEMT of claim 11, wherein a second portion of the field plate is between the active gate and the source region.

15. The HEMT of claim 11, wherein the active gate includes a p-type GaN (pGaN) layer underneath a metallic layer.

16. The HEMT of claim 11, wherein the distance is at least 10 nanometers.

17. A method comprising:
   forming a substrate including: a channel layer; a barrier layer on the channel layer; and a first dielectric layer on the barrier layer; and
   forming a high electron mobility transistor (HEMT) in the substrate such that the HEMT includes:
      an active gate on the substrate;
      a source region laterally to a first side of the active gate;
      a drain region laterally to a second; opposing side of the active gate;
      a field plate positioned laterally to a side of the active gate and including a first portion extending over the active gate;
      a second dielectric layer isolating a lower surface of the first portion of the field plate from an upper surface of the active gate by a distance D; and
      a field plate contact including a plurality of interconnect layers located vertically over the active gate and electrically coupled to the first portion of the field plate over the active gate and extending from the first portion of the field plate to a last metal layer.

18. The method of claim 17, wherein a second portion of the field plate is between the active gate and the drain region.

19. The method of claim 18, wherein the second portion of the field plate is at least partially positioned within the first dielectric layer.

20. The method of claim 17, wherein the distance D is at least 10 nanometers.

* * * * *